(12) United States Patent
Bloom et al.

(10) Patent No.: US 6,326,677 B1
(45) Date of Patent: Dec. 4, 2001

(54) BALL GRID ARRAY RESISTOR NETWORK

(75) Inventors: Terry R. Bloom, Middlebury; Stephen W. Burry, Berne; Lewis L. Seffernick, Decatur; Robert M. VandenBoom, Markle; John Zdanys, Jr., Elkhart, all of IN (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/146,826

(22) Filed: Sep. 4, 1998

(51) Int. Cl.$^7$ .............................. H01L 1/01; H01L 23/58; H01P 1/24; H05K 1/16

(52) U.S. Cl. .................... 257/638; 257/528; 257/536; 257/537; 257/738; 257/778; 257/775; 257/533; 257/532; 257/774; 257/421; 257/737; 257/723; 338/320; 338/309; 338/329

(58) Field of Search ........................ 257/638, 528–532, 257/723, 737, 738, 777, 536, 537, 775, 533, 774, 421, 787, 794, 778; 338/320, 309, 329, 239

(56) References Cited

U.S. PATENT DOCUMENTS

| | | |
|---|---|---|
| 4,225,468 | 9/1980 | Donohue et al. . |
| 4,300,115 | 11/1981 | Ansell et al. . |
| 4,332,341 | 6/1982 | Minetti . |
| 4,626,804 | 12/1986 | Risher et al. . |
| 4,654,628 | 3/1987 | Takayanagi . |
| 4,658,234 | 4/1987 | Takayanagi . |
| 4,712,161 | * 12/1987 | Pryor et al. ........................ 361/411 |
| 4,945,399 | 7/1990 | Brown et al. . |
| 5,216,404 | 6/1993 | Nagai et al. . |
| 5,379,190 | 1/1995 | Hanamura et al. . |
| 5,539,186 | * 7/1996 | Abrami et al. ........................ 219/548 |
| 5,557,502 | 9/1996 | Banerjee et al. . |
| 5,621,619 | 4/1997 | Seffernick et al. . |
| 5,629,838 | * 5/1997 | Knight et al. ........................ 361/782 |
| 5,635,767 | 6/1997 | Wenzel et al. . |
| 5,636,099 | 6/1997 | Sugawara et al. . |
| 5,661,450 | 8/1997 | Davidson . |
| 5,726,485 | 3/1998 | Grass . |
| 5,729,438 | * 3/1998 | Pieper et al. ........................ 361/760 |
| 5,745,334 | 4/1998 | Hoffarth et al. . |
| 5,760,662 | 6/1998 | Kalb et al. . |

(List continued on next page.)

OTHER PUBLICATIONS

US Patent Database Search Results, ITTL/"thick film" AND AN/"du pont": 52 patents, Jul. 10, 2001 9:11PM.
US Patent Database Search Results, TTL/"thick film": 433 patents, hits 1 through 50 out of 433, Jul. 10, 2001 9:18 PM.
Yahoo Search Results for "thick film", www.search.yahoo.com/bin/search?p=%22thick+film%22, Jul. 10, 2001 9:24 PM.
Magnitude–3 LLC—Home Page, www.mag3.com/index–f.htm, Jul. 10, 2001 9:33 PM.
DuPont Microcircuit Materials, www.dupont.com/mcm/, Jul. 10, 2001 9:34 PM.
Welcome to ESL, Inc., www.ElectroScience.com/, Jul. 10, 2001 9:35 PM.
Metech Home, www.metechinc.com, Jul. 10, 2001 9:41 PM.

Primary Examiner—Alexander O. Williams
(74) Attorney, Agent, or Firm—Mark P. Bourgeois; Albert W. Watkins; Mark W. Borgman

(57) ABSTRACT

A ball grid array resistor network has a substrate that has top and bottom surfaces. Resistors are disposed on the top surface. Conductors are disposed on the top surface, and each conductor is electrically connected to an end of each resistor. Vias extend through the substrate and are electrically connected to the conductors. Solder spheres are disposed on the bottom surface, and are electrically connected to the vias. A cover coat is disposed over the conductors and resistors. In an alternative embodiment, the vias are eliminated and the resistor network is formed on the bottom surface of the substrate. The resistor network provides a high density of resistors per unit area.

7 Claims, 4 Drawing Sheets

U.S. PATENT DOCUMENTS

| | | |
|---|---|---|
| 5,796,587 | 8/1998 | Lauffer et al. . |
| 5,870,274 | 2/1999 | Lucas . |
| 5,903,050 | 5/1999 | Thurairajaratnam et al. . |
| 5,923,077 | 7/1999 | Chase et al. . |
| 5,977,863 | 11/1999 | Bloom et al. . |
| 6,005,777 | 12/1999 | Bloom et al. . |
| 6,097,277 * | 8/2000 | Ginn et al. ............................ 338/320 |
| 6,103,146 | 8/2000 | Okamoto . |
| 6,124,634 * | 9/2000 | Akram et al. ........................ 257/698 |

* cited by examiner

BALL GRID ARRAY RESISTOR NETWORK

BACKGROUND OF THE PREFERRED EMBODIMENT(S)

1. Field of the Preferred Embodiment(s)

This invention generally relates to resistors for electronics. Specifically, the invention is a group of resistors mounted in a high density network or array package using spherical solder connections.

2. Description of the Related Art

Resistor networks are commonly used to terminate high speed digital signal lines to minimize unwanted reflections back through the transmission structure which is typically a printed circuit board. In most applications, the terminations are made by placing a resistor with a resistance matching the impedance of the transmission line, at the end of the transmission line. One end of the resistor is connected to a common termination voltage and the other end is connected to the signal line. For these applications, a bussed resistor network is a convenient solution, since one end of the termination is common to all signal lines.

The previous resistor network designs include surface mount, and through hole SIP and DIP versions.

Despite the advantages of each type of prior art resistor network, none have been easily or economically manufactured with a high density of interconnects per unit area on a printed circuit board. In particular, providing the electrical connections only on the periphery of the resistor network causes the electrical leads to be tightly spaced on the edge of the device, while the area in the interior of the device is unused for electrical interconnections.

Therefore, there is a current unmet and heretofore long felt need for a resistor network with higher density, low cross-talk noise and improved signal integrity.

DESCRIPTION OF RELATED ART

Examples of patents related to the present invention are as follows, and each patent is herein incorporated by reference for the supporting teachings:

U.S. Pat. No. 4,945,399, is an electronic package with integrated distributed decoupling capacitors.

U.S. Pat. No. 5,557,502, is a ball grid array package.

U.S. Pat. No. 4,300,115, is a multi-layer via resistor.

U.S. Pat. No. 4,658,234, is a resistor network.

U.S. Pat. No. 5,621,619, is an all ceramic surface mount sip and dip network having spacers and solder barriers.

U.S. Pat. No. 5,379,190, is a chip type composite electronic part.

U.S. Pat. No. 4,332,341, is a fabrication of circuit packages using solid phase solder bonding.

U.S. Pat. No. 5,539,186, is a temperature controlled multi-layer module.

U.S. Pat. No. 5,216,404, is a SIC thin film thermistor.

U.S. Pat. No. 4,654,628, is a network resistor unit.

U.S. Pat. No. 5,661,450, is a low inductance termination resistor array.

The foregoing patents reflect the state of the art of which the applicant is aware and are tendered with the view toward discharging applicant's acknowledged duty of candor in disclosing information that may be pertinent in the examination of this application. It is respectfully stipulated, however, that none of these patents teach or render obvious, singly or when considered in combination, applicant's claimed invention.

SUMMARY OF THE PREFERRED EMBODIMENT(S)

It is a feature of the invention to provide a ball grid array resistor network. Specifically, there is a substrate, several resistors, conductors, and vias arranged in a configuration. Solder spheres are used to connect the resistors to other electronic circuitry such as a printed circuit board.

It is a feature of the invention to provide a ball grid array resistor network including a substrate that has top and bottom surfaces. Resistors are disposed on the top surface. Conductors are disposed on the top surface, and each conductor is electrically connected to an end of each resistor. Vias extend through the substrate and are electrically connected to the conductors. Solder spheres are disposed on the bottom surface, and are electrically connected to the vias. A cover coat is disposed over the conductors and resistors.

It is a feature of the invention to provide a ball grid array resistor network which has a substrate with a bottom surface. Resistors are disposed on the bottom. Conductors are disposed on the bottom surface and each conductor is electrically connected to an end of each of the resistors. A glass cover coat having several apertures is disposed over the resistors, conductors and the bottom surface. The apertures are aligned with the conductors. Solder spheres are disposed at least partially in the apertures and are electrically connected to the conductors.

The invention resides not in any one of these features per se, but rather in the particular combination of all of them herein disclosed and claimed and it is distinguished from the prior art in this combination of all of its structures for the functions specified.

There has thus been outlined, rather broadly, the more important features of the invention so that the detailed description thereof that follows may be better understood, and so that the present contribution to the art may be better appreciated. There are, of course, additional features of the invention that will be described hereinafter and which will form the subject matter of the appended claims. Those skilled in the art will appreciate that the preferred embodiment may readily be used as a basis for the designing of other structures, methods and systems for carrying out the several purposes of the present invention. It is important, therefore, that the claims are regarded as including such equivalent constructions since they do not depart from the spirit and scope of the present invention.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings. The description of the invention may contain, for example, such descriptive terms as up, down, top, bottom, right or left. These terms are meant to provide a general orientation of the parts of the invention and are not meant to be limiting as to the scope of the invention.

DETAILED DESCRIPTION OF THE PREFERRED EMBODIMENT

Figure 1:
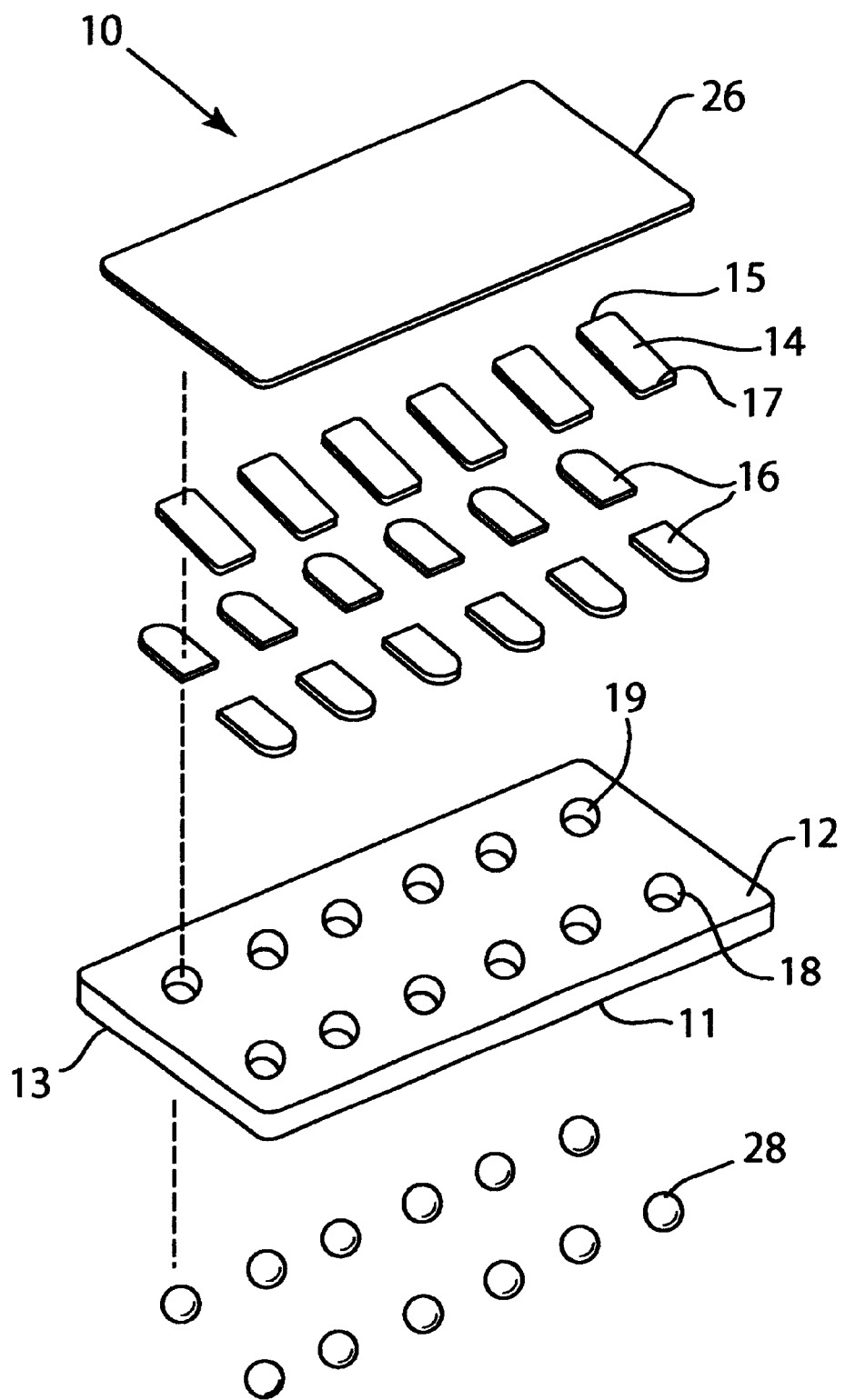
FIG. 1 is an exploded view of a ball grid array resistor network.
Figure 2:
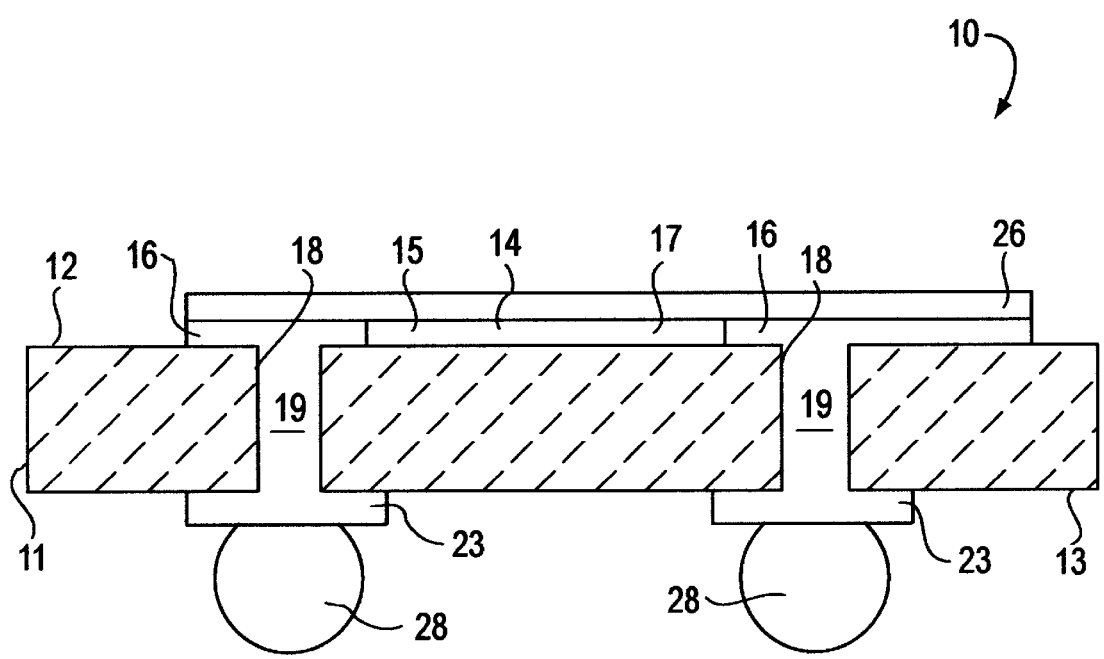
FIG. 2 is a cross-sectional view of the resistor network of FIG. 1 in its assembled state.

Referring to FIGS. 1 and 2, there is a ball grid array resistor network assembly 10. In particular, resistor network assembly 10 has a planar substrate 11 having a top surface 12 and a bottom surface 13. Substrate 11 is preferably made out of a ceramic material such as alumina oxide. Resistors 14 are disposed and trimmed on the top surface 12 by conventional thick film resistor processing techniques. Resistors 14 have a first end 15 and a second end 17. Conductors 16 are disposed on the top surface 12 by conventional thick film conductor processing techniques. Conductors 16 are placed one on each end 15 and 17 of resistors 14 and are electrically connected to ends 15 and 17. Conductors 16 and resistors 14 slightly overlap and sinter to form a mechanical and electrical bond during processing.

A pair of bottom conductors 23 is located on bottom surface 13. Ceramic substrate 11 has cylindrical vias 18 formed therein and which extend through the substrate 11 and are filled with a conductive via fill material 19. The via fill material 19 is a conventional thick film conductor that is screened into the vias and fired. The via fill material 19 electrically connects the top and bottom conductors 16 and 23. Solder spheres 28 are mechanically and electrically attached to the bottom conductors 23. Solder spheres may be 10% tin and 90% lead and are commercially available from Alpha Metals Corporation. The solder spheres can be other alloys such as 5–20% tin and 80–95% lead. Solder spheres 28 may be partially melted to attach to the conductors 23, typically using a screened on solder paste. Solder sphere 28 typically connects to an external electrical circuit such as on a printed circuit board. A cover coat 26 is placed over the resistors 14 and the conductors 16 to protect from corrosion and abrasion.

Resistor network assembly 10 is assembled by the following process sequence: Via fill material 19 is screened into vias 18 of substrate 11 and fired in an oven. The conductors 16 are screened onto top surface 12 and fired in an oven. Conductors 23 are screened onto bottom surface 13 and fired in an oven. The resistors 14 are screened onto top surface 12 and fired in an oven. Next, the resistors 14 are laser trimmed to their proper resistance value and a cover coat 26 is screened on and cured. Solder paste is screened onto conductors 23. Solder spheres 28 are placed onto conductors 23 and reflowed to bond to conductors 23. Finally, the assembly 10 is tested.

Figure 3:
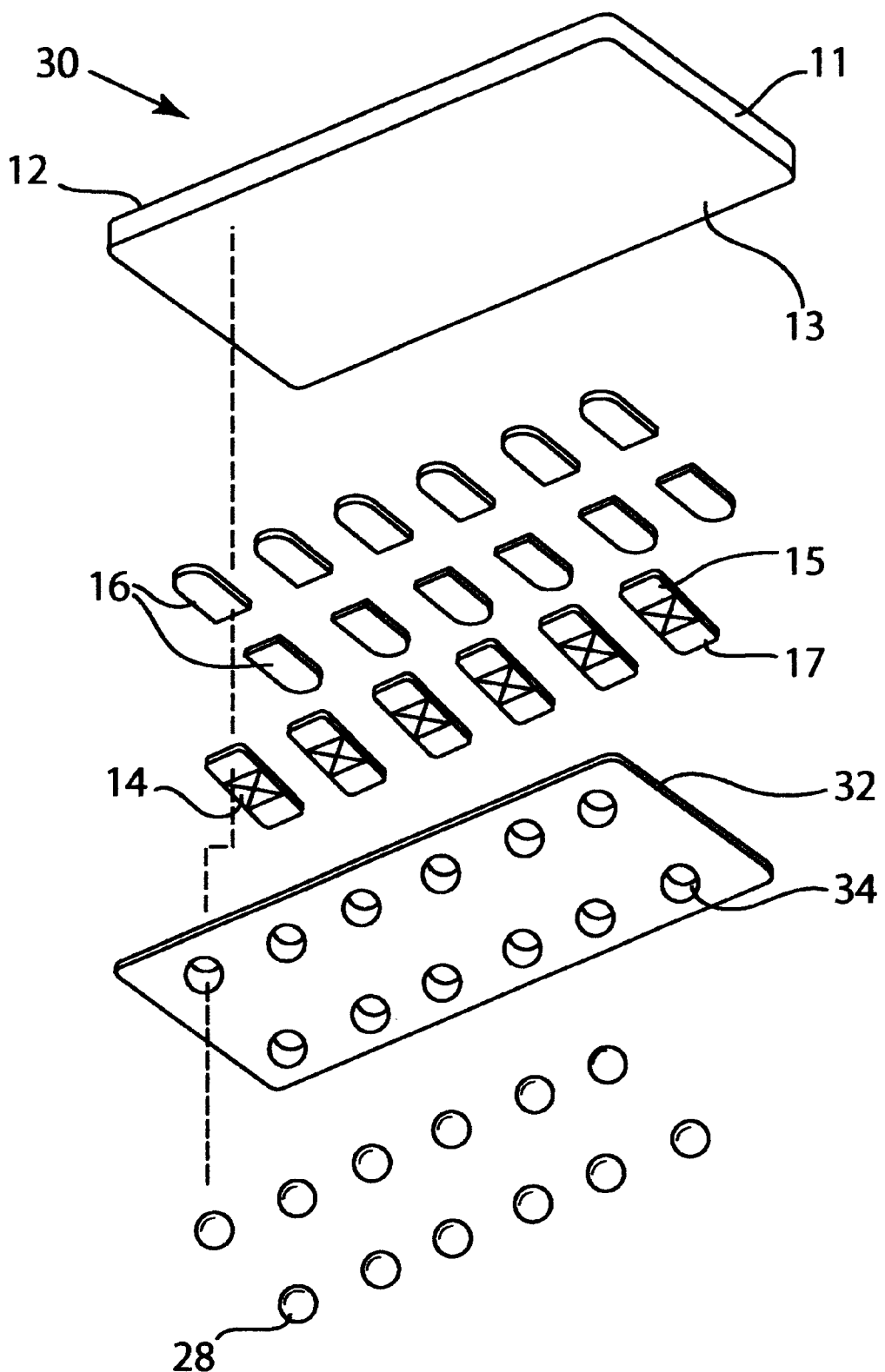
FIG. 3 is an exploded view of an alternative embodiment of the ball grid array resistor network.
Figure 4:
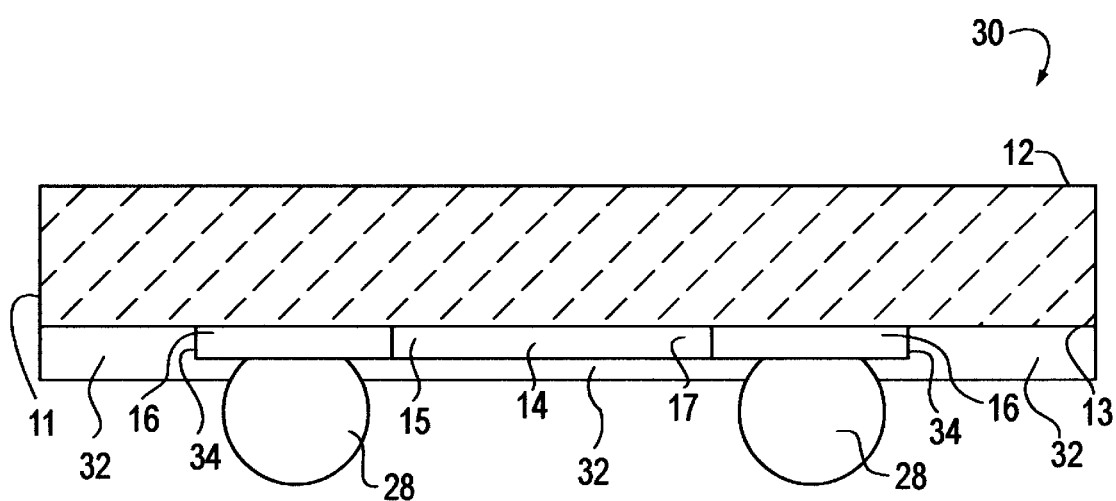
FIG. 4 is a cross-sectional view of the resistor network of FIG. 3 in its assembled state.

FIG. 3 shows an exploded view of an alternative embodiment of the ball grid array resistor network. Referring to FIGS. 3 and 4, elements that are in common to FIGS. 1 and 2 are given the same reference designator. A resistor network assembly 30 has a substrate 11 to which conductors 16 are located on bottom surface 13. Substrate 11 is preferably made out of a ceramic material such as alumina oxide. Resistors 14 are disposed and trimmed on the bottom surface 13 by conventional thick film resistor processing techniques. Resistors 14 have a first end 15 and a second end 17. Conductors 16 are disposed on the bottom surface 13 by conventional thick film conductor processing techniques. Conductors 16 are located on each end 15 and 17 of resistors 14 and are electrically connected to ends 15 and 17. Conductors 16 and resistors 14 slightly overlap and sinter to form a mechanical and electrical bond during processing.

A glass cover coat 32 is located over and covers the resistors 14, conductors 16 and bottom surface 13. The glass cover coat is deposited using conventional thick film processing techniques. An array of apertures 34 are located in the glass cover coat 32 below the conductors 16. Solder spheres 28 are mechanically and electrically attached to the conductors 16. Solder spheres 28 extend through the apertures 34 to attach with conductors 16. Solder spheres 28 may be 10% tin and 90% lead and are commercially available from Alpha Metals Corporation. The solder composition could be other alloys such as from 5–20% tin and from 80–95% lead. The Solder spheres 28 may be partially melted to attach to the conductors 16, typically using a screened on solder paste. Solder sphere 28 typically connects to an external electrical circuit such as on a printed circuit board (not shown). Glass cover coat 32 protects the resistors 14 and conductors 16 from corrosion and abrasion and acts as a solder dam when the solder spheres 28 are reflowed. Resistor network 30 avoids the use of a ceramic with vias and having to fill the vias with a conductive via fill.

Resistor network assembly 30 is assembled by the following process sequence: Conductors 16 are screened onto bottom surface 13 and fired in an oven. Resistors 14 are screened onto bottom surface 13 and fired in an oven. Next, resistors 14 are laser trimmed to their proper resistance value. A glass cover coat 32 is screened on over the resistors and conductors and fired in an oven. Solder paste is screened onto conductors 16. Solder spheres 28 are placed onto conductors 16 and reflowed to bond to conductors 16. Finally, the assembly 10 is tested.

VARIATIONS OF THE PREFERRED EMBODIMENTS(S)

One of ordinary skill in the art of making resistors, will realize that there are many different ways of accomplishing the preferred embodiment. For example, although it is contemplated to make substrate 14 out of ceramic, other suitable materials would work, like polyamide or FR4. These materials would require a different resistor system. Additionally, although only one group of 6 resistors was shown on substrate 11, more or fewer resistors 14 could be placed. Additionally more or fewer rows of solder spheres could be used.

It is further possible to have other electrical connections through the substrate other than conductor filled vias. It is possible to use staked copper or metal pins in place of the via fill material 19.

The specification has shown the resistor network assembly 10 with a cover coat 26. It is contemplated, however, to omit the cover coat.

Another variation of the preferred embodiment is to use other types of solder preforms in place of solder spheres 28. For example, solder donuts or wire or squares could be used. Further, the solder could be made from materials other than tin/lead. For example, a mixture of tin/indium or tin/bismuth could be used if a lower melting solder is desired. A mixture of tin/silver or tin/antimony could be used if a higher temperature solder is desired.

Further, the steps of processing sequence could be modified from that shown in the specification to produce the same end result. For example, resistors 14 could be placed before conductors 16 or the screening of bottom conductors 23 could be omitted and solder spheres 28 reflow soldered directly to via fill material 19.

If desired, other electrical elements could be added to resistor network 10 or 30 such as capacitors or inductors to make a filter, for example.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A ball grid array resistor network, comprising:
   a) a substrate having a first surface;
   b) a plurality of thick film resistors disposed on the first surface;
   c) a plurality of thick film conductors, disposed on the first surface, and each conductor electrically connected to at least one of the resistors;
   d) a thick film cover coat having a plurality of apertures, aligned with the conductors, and disposed over the resistors, conductors and first surface; and
   e) a plurality of solder spheres, disposed at least partially in the apertures, and electrically connected to the conductors.

2. The ball grid array resistor network according to claim 1, wherein the substrate is ceramic.

3. The ball grid array resistor network according to claim 1, wherein the cover coat is glass.

4. The ball grid array resistor network according to claim 1, wherein the composition of the solder spheres ranges from 5–20% tin and from 80–95% lead.

5. A ball grid array resistor network, comprising:
   a) a substrate;
   b) at least one thick film resistor, disposed on the substrate and having a first and a second end;
   c) a first and a second solder sphere electrically connected to said first and said second end of the thick film resistor, respectively; and
   d) a thick film glass cover coat between said first and second solder spheres and said at least one thick film resistor, said cover coat having apertures therethrough permitting electrical connection between said at least one thick film resistor and said first and second solder spheres.

6. The ball grid array resistor network according to claim 5, wherein, the substrate is ceramic.

7. The ball grid array resistor network according to claim 5, wherein, the resistor network has a conductor located on the substrate between the resistor and the solder sphere.

* * * * *